United States Patent
Ke et al.

(10) Patent No.: US 9,363,919 B2
(45) Date of Patent: Jun. 7, 2016

(54) SUPPORTING FRAME FOR COMPUTER EXPANSION CARD

(71) Applicant: GIGA-BYTE TECHNOLOGY CO., LTD., New Taipei (TW)

(72) Inventors: Chih hua Ke, Taipei (TW); Yung Shun Kao, New Taipei (TW); Ya Han Chang, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 280 days.

(21) Appl. No.: 14/050,354

(22) Filed: Oct. 10, 2013

(65) Prior Publication Data
US 2014/0328035 A1    Nov. 6, 2014

(30) Foreign Application Priority Data
May 3, 2013    (TW) .............. 102115955 A

(51) Int. Cl.
*H05K 7/14*    (2006.01)
*G06F 1/18*    (2006.01)

(52) U.S. Cl.
CPC .............. *H05K 7/1418* (2013.01); *G06F 1/185* (2013.01); *H05K 7/1439* (2013.01)

(58) Field of Classification Search
CPC .... H05K 7/1418; H05K 7/1429; G06F 1/185; G06F 1/184
See application file for complete search history.

(56) References Cited

U.S. PATENT DOCUMENTS

| 5,868,585 A | 2/1999 | Barthel et al. | |
|---|---|---|---|
| 5,957,465 A | 9/1999 | Gonsalves et al. | |
| 6,058,025 A * | 5/2000 | Ecker | G06F 1/184 361/753 |
| 6,972,370 B2 | 12/2005 | Wang et al. | |
| 2004/0174687 A1* | 9/2004 | Wang | G06F 1/184 361/801 |
| 2004/0184252 A1* | 9/2004 | Lin | G06F 1/184 361/801 |
| 2005/0059285 A1* | 3/2005 | Chen | G06F 1/184 439/325 |
| 2006/0120030 A1* | 6/2006 | Huang | G06F 1/184 361/679.02 |
| 2006/0198115 A1* | 9/2006 | Chen | G06F 1/184 361/796 |
| 2007/0081316 A1* | 4/2007 | Peng | G06F 1/185 361/801 |
| 2009/0168376 A1* | 7/2009 | Tang | G06F 1/186 361/756 |
| 2009/0231798 A1* | 9/2009 | Skinner | G06F 1/185 361/679.31 |

(Continued)

FOREIGN PATENT DOCUMENTS

| CN | 202166939 U | 3/2012 |
|---|---|---|
| JP | 63-191687 U | 12/1988 |

(Continued)

*Primary Examiner* — Hoa C Nguyen
*Assistant Examiner* — Keith Depew
(74) *Attorney, Agent, or Firm* — Chun-Ming Shih

(57) ABSTRACT

A supporting frame includes a first engagement section, a supporting section and a second engagement section. The first engagement section is fixed on one side of the motherboard. The supporting section is connected between the first engagement section and the second engagement section and is adjacent to another side of the motherboard. The second engagement section is spaced apart from the first engagement section for fixing a fastening plate of the expansion card. In this way, the motherboard could be placed on a working surface horizontally or stands upright on the working surface with the support of the supporting frame.

13 Claims, 9 Drawing Sheets

(56) References Cited

U.S. PATENT DOCUMENTS

| | | | | |
|---|---|---|---|---|
| 2009/0296358 A1* | 12/2009 | Tsai | ........................ | G06F 1/185 361/759 |
| 2010/0296242 A1 | 11/2010 | Fan et al. | | |
| 2011/0051365 A1 | 3/2011 | Tung et al. | | |
| 2012/0119631 A1* | 5/2012 | Lu | ........................ | H05K 7/1429 312/223.2 |
| 2012/0176747 A1* | 7/2012 | Ye | ............................ | G06F 1/20 361/695 |
| 2012/0224340 A1* | 9/2012 | Geng | ....................... | G06F 1/186 361/759 |
| 2012/0270421 A1* | 10/2012 | Sun | ........................ | H05K 3/361 439/66 |
| 2012/0287570 A1* | 11/2012 | Wu | ........................ | G06F 1/185 361/679.32 |
| 2013/0128464 A1* | 5/2013 | Chen | ....................... | H05K 7/026 361/721 |
| 2013/0288532 A1* | 10/2013 | Lai | ........................ | G06F 1/185 439/629 |
| 2013/0321241 A1* | 12/2013 | Lin | ...................... | H01Q 1/2275 343/906 |

FOREIGN PATENT DOCUMENTS

| | | |
|---|---|---|
| JP | 3-90489 U | 9/1991 |
| TW | 200523717 A | 7/2005 |

* cited by examiner

SUPPORTING FRAME FOR COMPUTER EXPANSION CARD

BACKGROUND OF THE INVENTION

1. Field of the Invention

This disclosure relates to a supporting frame for computer motherboard and, more particularly, to a supporting frame for installing expansion card.

2. Related Art

With the increasing growth and affordability of hardware components, computer users and testing engineers prefer to install hardware components without the hardware case. During the testing and assembly process, it is a common practice to test efficiency of a variety of electronic devices. It is also necessary to test each combination of the computer components so as to assemble the best deployment mode to reach the maximum efficiency of the computer. Therefore, computer users and testing engineers often need to insert electronic devices onto the motherboard or to test the electrical connecting joints of the motherboard.

Hence, computer users and testing engineers usually choose to test the efficiency of the computer in its bare form (bare machine); in other words, they remove the computer case in order not to devote too much time in assembling or detaching the computer case while inserting electronic devices onto the motherboard or testing the electrical signals so as to change the equipment of the computer system or adjust the existing configuration of the computer.

When computer users or testing engineers use a bare machine, they usually insert a variety graphic and sound cards, or other types of expansion cards on the motherboard. However, in the absence of a computer case supporting the weight of the motherboard, when the slots of the main board are occupied with heavier expansion cards such as high level graphic cards, the weight of the expansion card is not even. As a result, it often causes the pins of the motherboard connected with the expansion card in the slots to receive uneven force. The pins receiving heavier force may experience elastic fatigue and may not form optimal electrical contact with the interface (such as gold fingers) of the expansion card. This may affect the signal transition between the pins and the interface and damage the slot.

Therefore, during the testing of the main boards, computer users or testing engineers must move the testing tools into the gap between the main board and the operation place or to search the locations of the electrical connecting joints located at the backside of the main board from a lower position to an upper position. These motions cause inconvenience the users and may facilitate inaccurate testing results. Furthermore, improper handling of the motherboard may cause physical injury and may also damage the motherboard.

SUMMARY OF THE INVENTION

In view of the limitations described above, this disclosure provides a supporting frame for expansion card to solve the problem that is created when the expansion card is installed on the motherboard in the absence of a computer case, producing uneven force that may damage motherboard. The device is designed to mitigate the weight of the expansion card and provide users with a convenient and safe working environment for testing and assembly.

The supporting frame is adapted for fixing at least one expansion card to a motherboard. The motherboard includes a first side, a second side adjacent to the first side, and at least a slot.

The expansion card is inserted in the slot and includes a fastening plate located on one side of the expansion card far from the slot.

The supporting frame includes a first engagement section, a supporting section, and a second engagement section. The first engagement section is fixed on the first side of the motherboard. The supporting section is connected to one end of the first engagement section adjacent to the second side. The second engagement section is connected to the supporting section. In addition, the second engagement section is spaced apart from the first engagement section.

A height is defined by the second engagement section relative to the motherboard. The second engagement section matches with the fastening plate of the expansion card. The fastening plate is fixed on the second engagement section, allowing the motherboard to be positioned on a working surface horizontally or stand on the working surface via the second side and the supporting section.

This disclosure further provides another supporting frame. The supporting frame is adapted for fixing at least one expansion card to a motherboard. The supporting frame includes a first engagement section, a supporting section, and a second engagement section.

The first engagement section is used for being fixed on a first side of the motherboard. The supporting section is connected to the first engagement section.

The second engagement section is connected to the supporting section, and is spaced apart from the first engagement section.

Thereby, a height is defined by the second engagement section relative to the motherboard, and the second engagement section matches with a fastening plate of the expansion card. In other words, the fastening plate is fixed on the second engagement section.

The second engagement section includes a fixing end and a free end. The fixing end is connected to the supporting section. The free end is extended toward a second side of the motherboard, and corresponds to the second side. Thereby, the motherboard may be positioned on a working surface or stand on the working surface via the second side and the free end.

Accordingly, this disclosure provides the same supporting function as the common computer case of the computer, allowing the users to install expansion card onto the motherboard by the way that the first engagement section of the supporting frame directly fixed on the motherboard, and the fastening plate of the expansion card fixed on the second engagement section.

Thereby, the force from the weight of the expansion card is dispersed through the supporting frame and evenly distributed to the slot of the motherboard so as to prevent the damage of the slot and improve the transfer of electrical signals between the motherboard and then expansion card.

Furthermore, the supporting frame can be used as a frame to support the motherboard when computer case is removed. Thus, the motherboard may be positioned to stand on a desk or working surface with the support of the supporting frame so as to let users insert expansion cards into the motherboard horizontally or perpendicularly on the working surface. As a result, the frame creates convenience for the users by removing the hassle associated with inserting electronic devices and testing the efficiency of the computer. Furthermore, this removes the need to physically handle the motherboard, creating a safer working environment for the users and engineers.

The present invention will become more obvious from the following description of the preferred embodiments taken in conjunction with the accompanying drawings.

BRIEF DESCRIPTION OF THE DRAWINGS

The present invention will become more fully understood from the detailed description given herein below for illustration only and thus not limitative of the present invention, wherein.

DETAILED DESCRIPTION OF THE INVENTION

Figure 1:
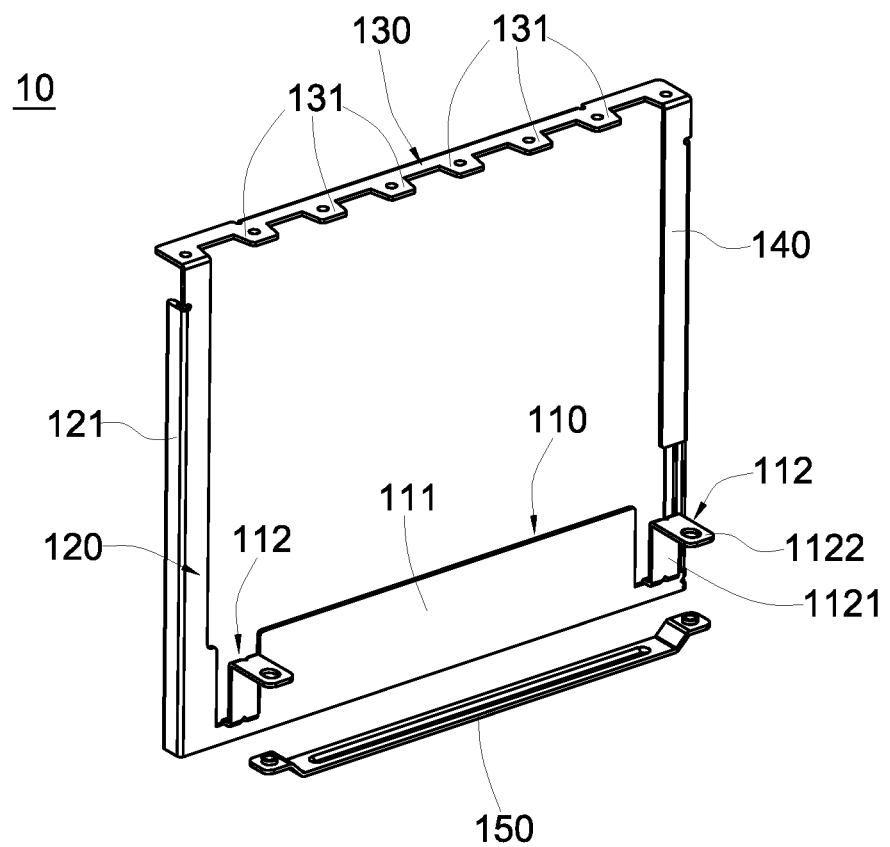
FIG. 1 is a perspective view of the supporting frame in accordance with a first embodiment.

Please refer to FIGS. 1 to 5. The supporting frame 10 of the disclosure is adapted for expansion cards 30 such as graphic card, TV card, sound card or other types of interface cards which can expand or enhance functions of the computer to install onto a motherboard 20. Therefore, the supporting frame 10 is regarded as a frame of a bare machine for the motherboard, and thus the motherboard and the supporting frame form a bare computer system. In the following embodiments, the supporting frame is used for installing the graphic card on the main board, but this is not limited to graphic cards alone and may be used to support the motherboard or other expansion cards.

In addition, after the supporting frame 10 is attached to the motherboard 20 to form the bare computer system, users are able to place the motherboard 20 horizontally on a working surface 40 such as a desk or an operation platform, or to have the motherboard 20 stand on the working surface with the support of the supporting frame. This helps to increase the convenience of the users and engineers during the testing and assembly stage when the computer case is not used.

It is understandable that common motherboard 20 includes a first side 210 and a second side 220 adjacent to the first side 210. Two positioning holes are placed with a distance on the first side 210.

Additionally, at least one slot 230 is placed electrically between the first side and the second side. The slot 230 is placed near one side of the second side 220 of the motherboard 20. In addition, one end of the slot 230 is near the first side 210 of the motherboard 20. Another end of the slot 230 is extended away from the first side 210, and is parallel to the second side 220 of the motherboard 20.

The expansion card 30 is electrically inserted into the slot 230 via an interface (such as Gold Finger) of the expansion card 30. The expansion card 30 includes a fastening plate 310, placed on one side of the expansion card 30 opposite to the slot 230. The fastening plate 310 is used for fixing the expansion card 30 on the supporting frame 10.

The forms of the motherboard 20, the disposition mode of the slot 230, and the structure of the expansion card 30 are techniques in the art, and also are not the technical feature that this disclosure focuses on. Therefore, it is not described in this submission.

Figure 2:
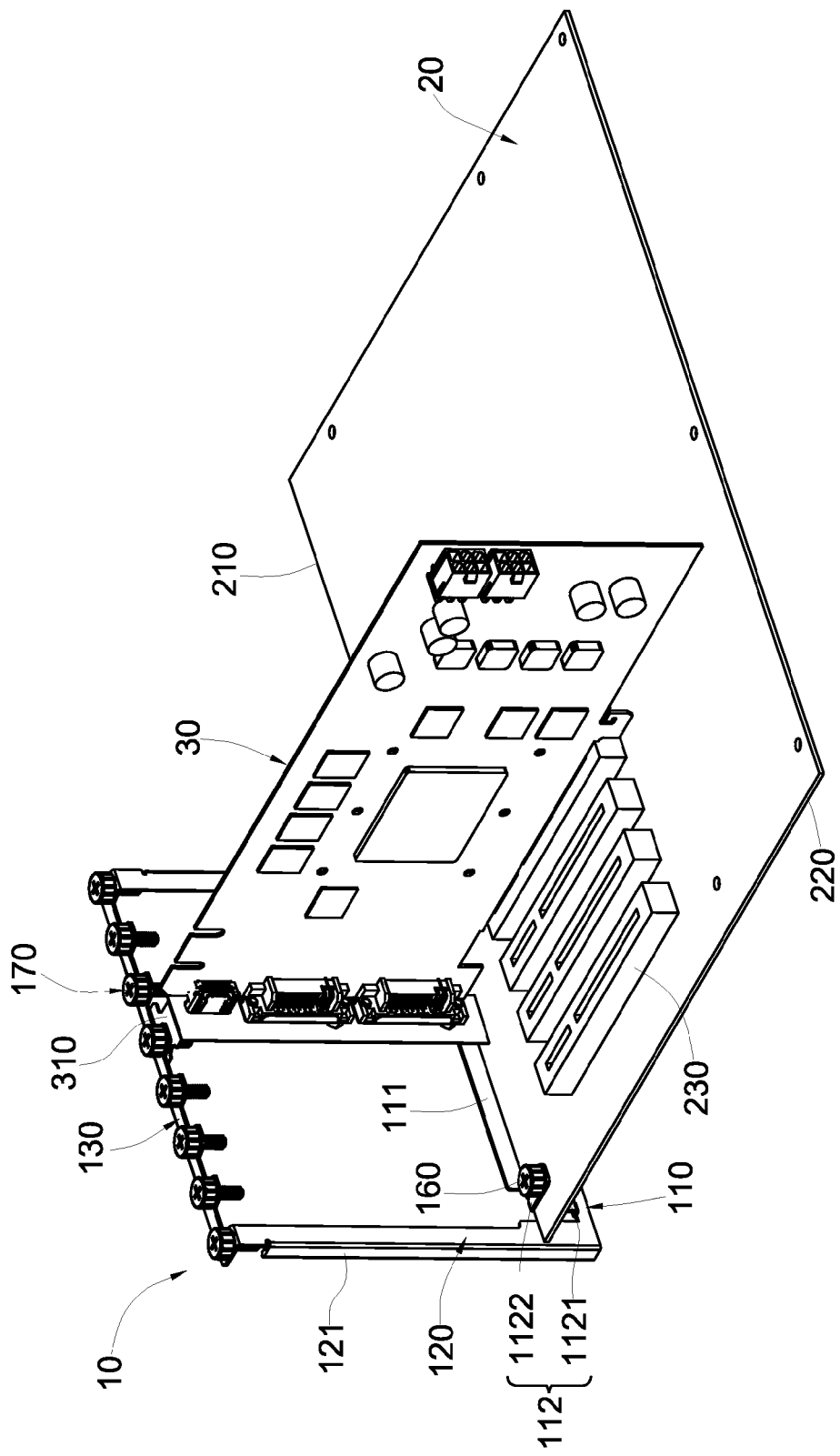
FIG. 2 is a perspective view of assembly in accordance with the first embodiment.
Figure 3:
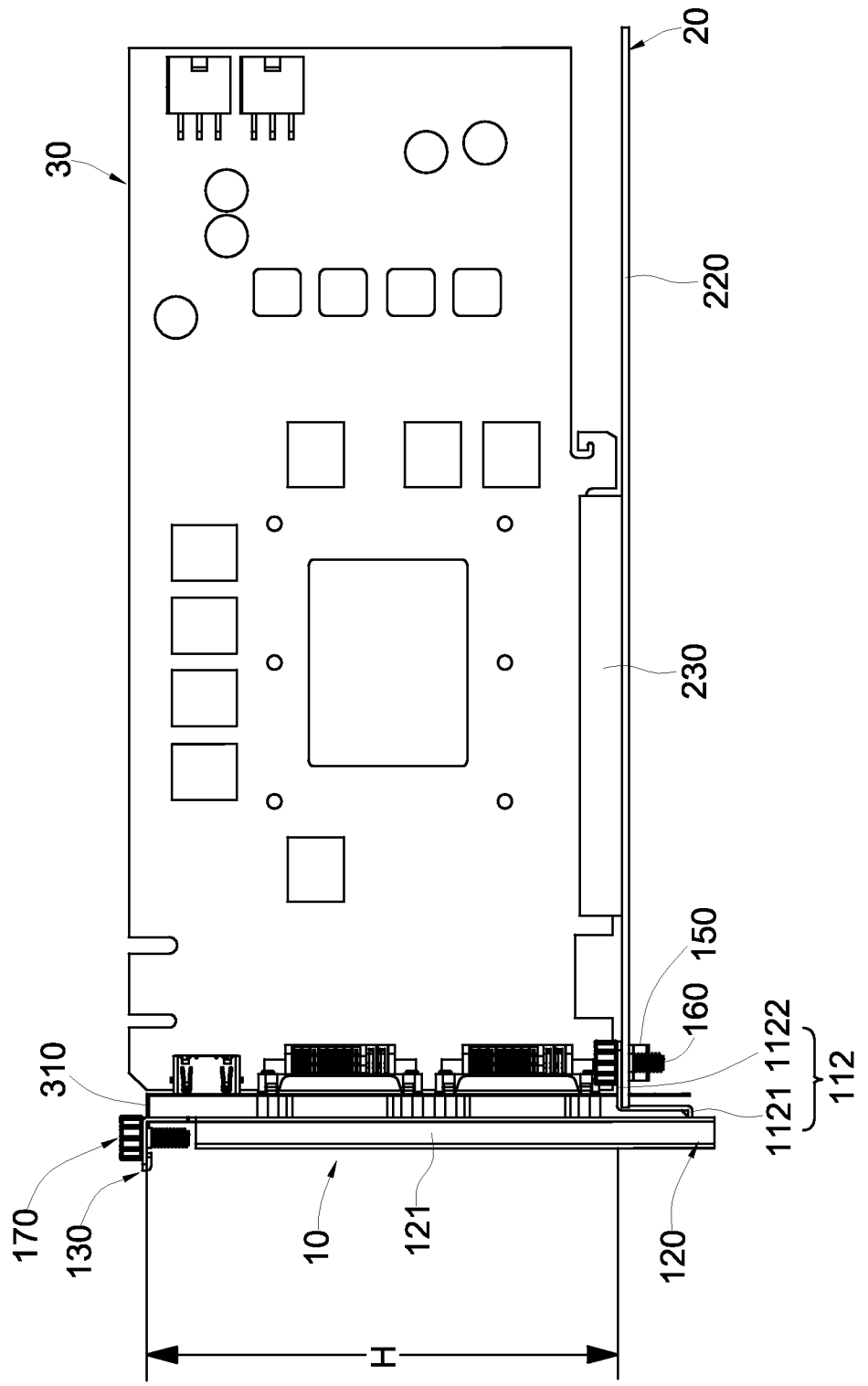
FIG. 3 is a side, schematic view of the supporting frame in accordance with the first embodiment.

According to FIGS. 1 to 3, the supporting frame 10 in accordance with the first embodiment includes a first engagement section 110, a supporting section 120, a second engagement section 130 and an assisting section 140.

The supporting section 120 and the assisting section 140 are connected with two opposite ends of the first engagement section 110, respectively. The supporting section 120 and the assisting section 140 are perpendicularly connected respectively between the first engagement section 110 and the second engagement section 130. In this way, the first engagement section 110, the supporting section 120, the second engagement section 130, and the assisting section 140 are formed integrally as a rectangular frame.

The first engagement section 110 of the supporting frame 10 includes a main body 111 and two bending plates 112. The main body 111 is connected between the supporting section 120 and the assisting section 140.

The two bending plates 112 are spaced apart from each other and are placed on the main body 111. The two bending plates 112 correspond to the two positioning holes of the motherboard 20 respectively. The two bending plates 112 can be extended from the main body 111 but should not be limited. Each of the bending plates 112 includes a perpendicular portion 1121 and a bending portion 1122. The perpendicular portion 1121 is parallel to the supporting section 120. The bending portion 1122 is perpendicular to the supporting section 120. In addition, pluralities of holes corresponding to the positioning holes of the motherboard 20 are placed on the bending portion 1122.

The second engagement section 130 of the supporting frame 10 is connected between the supporting section 120 and the assisting section 140. At least one engagement portion 131 is placed with a distance on the second engagement section 130. The location and the number of the engagement portions 131 correspond to and depend on the location and the number of the slots 230 of the motherboard 20.

During the engagement procedure of the supporting frame 10 engaged with the motherboard 20, the two bending plates 112 of the first engagement section 110 are fixed on the first side 210 of the motherboard 20 respectively. Each perpendicular portion 1121 of each bending plate 112 lean on the first side 210 of the motherboard 20, so as to have the bending portion 1122 contacted the surface of the motherboard 20, and have the hole of the bending portion 1122 matched with the positioning hole of the motherboard 20. Then, one end of each of the locking members 160, such as screw or bolt, is moved through the hole of the bending portion 1122 and locked in the positioning hole of the motherboard 20 respectively. Another end of each of the locking members 160 is pressed against each bending portion 1122 of each bending plate 112 so as to have the two bending plates 112 fixed on the motherboard 20 respectively.

Furthermore, to increase the stability during engagement of the supporting frame 10 and the motherboard 20, it is possible to install a pressing plate 150 to the opposite side of motherboard 20 relative to the bending plates 112.

After the locking member 160 being moved through the positioning hole of the motherboard 20, the locking member 160 is locked directly into the pressing plate 150.

In this way, the motherboard 20 can be clamped between the two bending plates 112 and the pressing plate 150 so as not to be detached from the supporting frame easily.

It is evident that even though the supporting frame 10 is locked or engaged with the motherboard 20 with the locking member 160 in accordance with the first embodiment, the way of the engagement with the motherboard 20 can be chosen by changing the structure of the first engagement section of supporting frame 10. For example, the supporting frame can be fixed on the motherboard by using other engagement methods such as using rivets or soldering. In another example, the first engagement section 110 can be designed as a recess, and thus, part of the motherboard 20 can be embedded into the recess so as to engage the supporting frame 10 with the motherboard 20. In other words, the engagement way of the supporting frame 10 and the motherboard should not be limited to the method described in the first embodiment.

It is notable that when the first engagement section 110 is fixed on the first side 210 of the motherboard 20, one side of the supporting section 120 of the supporting frame 10 corresponds, or matches to the second side 220 of the motherboard 20. In other words, one side of the supporting section 120 can be made a little protruding or flush with the second side 220 of the motherboard 20, or can be near the second side 220 of the motherboard 20 and spaced apart with a little distance from the second side 220.

In addition, the length of the supporting section 120 of the supporting frame 10 can be longer than or the same as the height of the expansion card 30 on the motherboard 20. In this way, a height H is defined between the second engagement section 130 and the motherboard 20.

The height H matches with the height of the expansion card 30 on the motherboard 20. Therefore, the engagement portion 131 of the second engagement section 130 corresponds to the fastening plate 310 of the expansion card 30. Thereby, the fastening plate 310 of the expansion card 30 can be fixed on the engagement portion 131 of the second engagement section 130 with a securing unit 170.

The securing unit 170 can be a single strip or an assembly of a plurality of screws or bolts. In the use of a single strip, two coupling members can be placed respectively at two opposite ends of the single strip, and couple to the two opposite ends of the second engagement section 130.

In another example, the single strip can be pivotally connected in one end of the second engagement section 130. Therefore, the fastening plate 310 of the expansion card 30 can be clamped between the strip and the engagement portion 131 of the second engagement section 130 in the way that the strip pivotally couples to the second engagement section 130.

In this embodiment, the securing unit 170 contains a plurality of screws. The fastening plate 310 of the expansion card 30 is locked together with the engagement portion 131 of the second engagement section 130 by the screws.

Please further refer to FIGS. 1 to 5. After the engagement of the supporting frame 10, the motherboard 20 and the expansion card 30, users can place the motherboard 20 horizontally or perpendicularly on a working surface 40 for operation.

Figure 4:
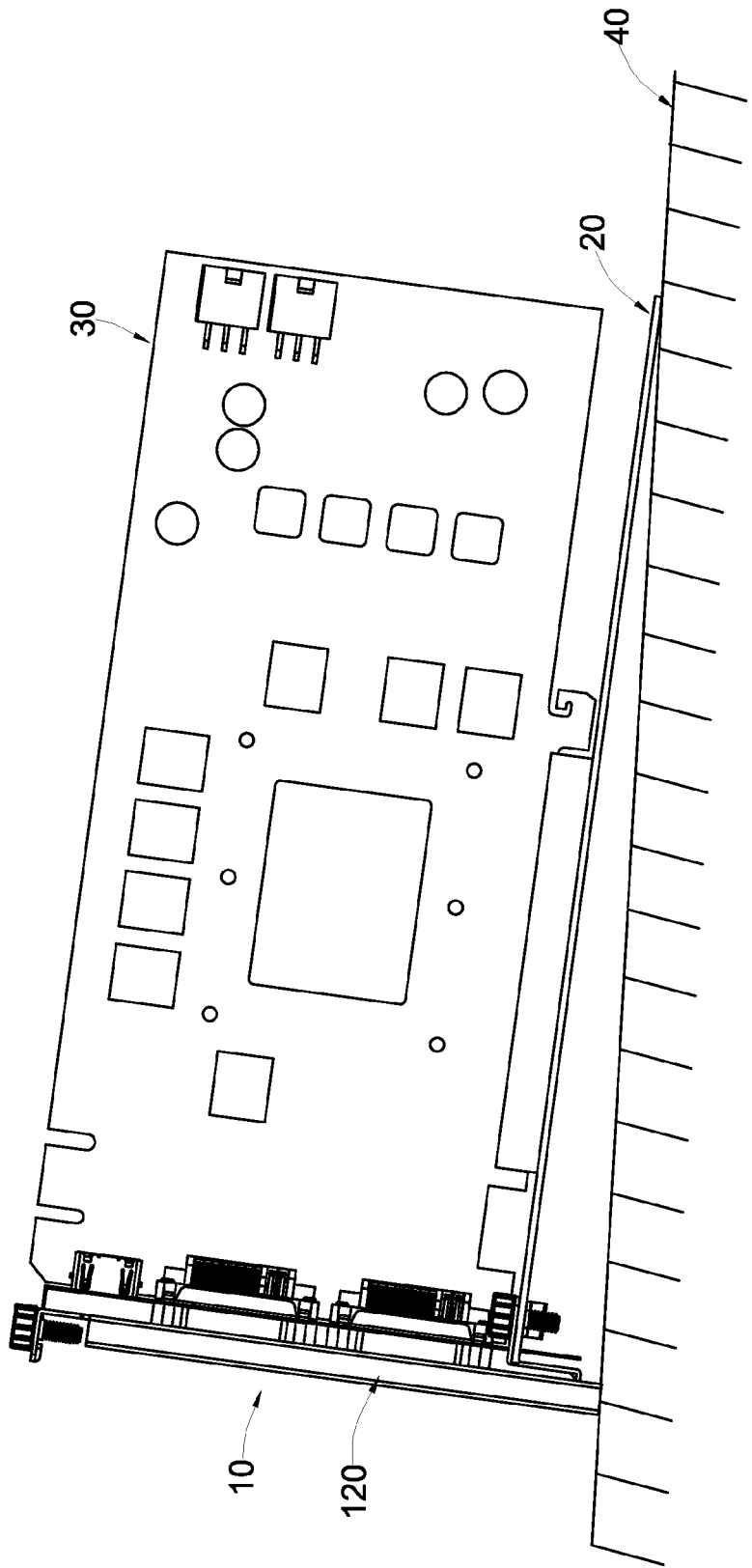
FIG. 4 is a side, schematic view of the supporting frame in use situation in accordance with the first embodiment.

If the motherboard 20 is positioned horizontally on the working surface 40, in one embodiment that the length of the supporting section 120 of the supporting frame 10 is longer that the height of the expansion card 30 on the motherboard 20, than the supporting section 120 of the supporting frame 10 is across the two opposite sides of the motherboard 20. Therefore, the main body 111 of the first engagement section 110 and the second engagement section 130 are located in the two opposite sides of the motherboard 20 respectively. In this way, the motherboard 20 may lean on the working surface 40 with the support from the first engagement section 110 of the supporting frame 10 (as shown in FIG. 4). Therefore, a space is defined between the motherboard 20 and the working surface 40, and it can be used as a heat dissipation space for the motherboard 20 to dissipate heat while in operation.

Figure 5:
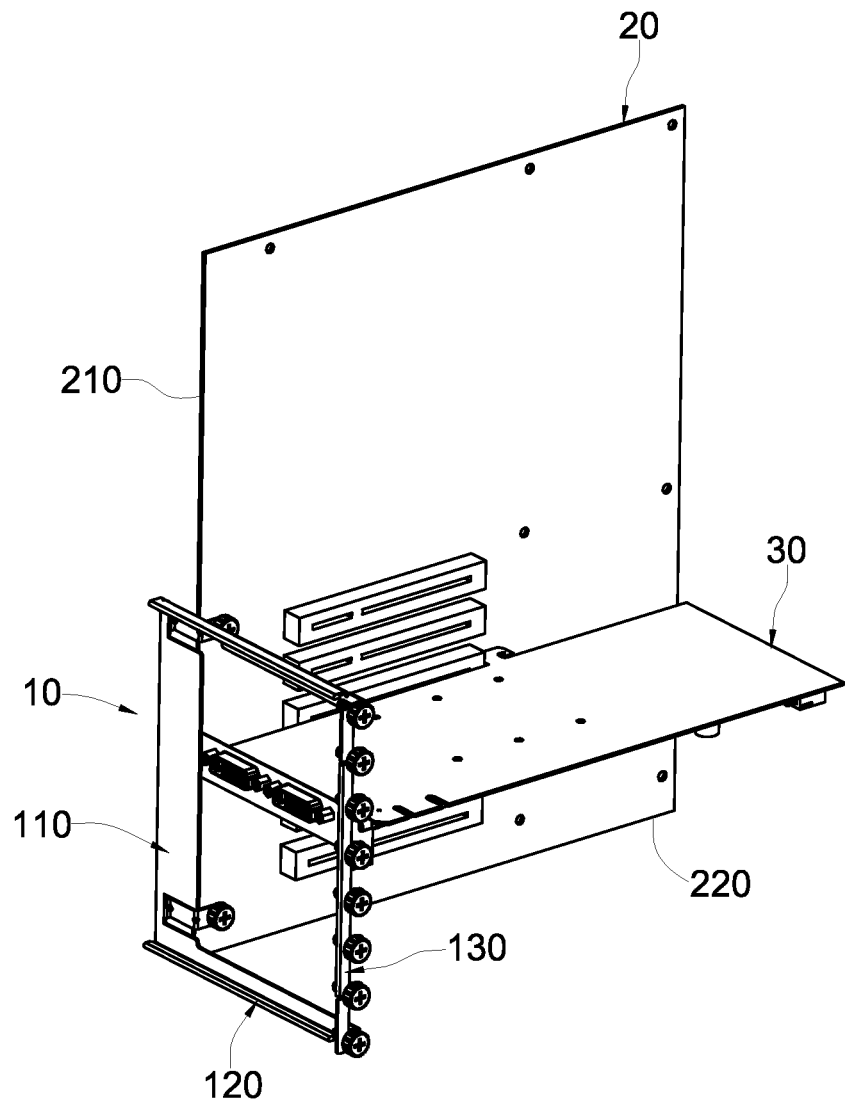
FIG. 5 is a side, perspective view of the supporting frame in use situation in accordance with the first embodiment.

In an event the motherboard 20 is placed perpendicularly on the working surface, the motherboard 20 stands upright on the working surface with the support from the supporting section 120 of the supporting frame 10 and the second side 220 of the motherboard 20 (as shown in FIG. 5). When this happens, the expansion card 30 is also placed steadily on the slot 230 of the motherboard 20 with the support of the second engagement section 130 of the supporting frame 10.

In this way, the force from the weight of the expansion card 30 to the slot 230 can be dispersed effectively so as to ensure that the pins in the slot 130 for electrically connecting with the expansion card 30 will not be subject to uneven force. Hence, pins in the slot 30 can avoid elastic fatigue and damage.

Particularly, during the situation that a plurality of expansion cards 30 are installed on the motherboard 20, the inclination of the expansion cards 30 on the motherboard 20 can be prevented with the support from the supporting frame 10 so as to prevent the Scalable Link Interface, SLI or bridge devices such as CROSSFIRE, connected between two expansion cards 30 from abnormal operating with the expansion cards 30 due to the disengagement of the pins.

In addition, because the motherboard 20 is able to stand on the working surface with the support from the supporting frame 10, users are able to test electrical signals from the electrical connecting joints placed at one side opposite to the slot 230 of the motherboard 20 when the computer case is removed by users. Thus, the motherboard can be positioned in a manner it typically sits within the computer case, in addition to increasing the convenience of testing and assembly.

In this embodiment, to increase the stability of the motherboard 20 standing on the working surface, it is possible to bend the supporting section 120 of the supporting frame 10 to form a contacting surface 121. The contacting surface 121 is flush with the second side 220 of the circuit 20. When the motherboard 20 is on the working surface it can lean on the working surface via the contacting surface 121 of the supporting section 120 in order to increase the contacting area between the supporting frame 10 and the working surface so as to increase the supporting efficiency.

Meanwhile, in the embodiment that the length of the supporting section 120 is long enough to be placed across the opposite two sides of the motherboard 20 and the risk of leaning forward or backwards can be decreased when the motherboard 20 stands on the working surface.

In the embodiment described above, pluralities of engagement portions of the second engagement section of the supporting frame are disclosed. However, in some other embodiments, the number of engagement portions can be designed depending on different size, or standard of the motherboard. For example, in some motherboard with small size, only one slot can be used. In this situation, it is not advisable to place pluralities of slots on the second engagement section, but is also inconvenient due to the size of supporting frame which cannot be smaller to match with the size of the motherboard.

Figure 6:
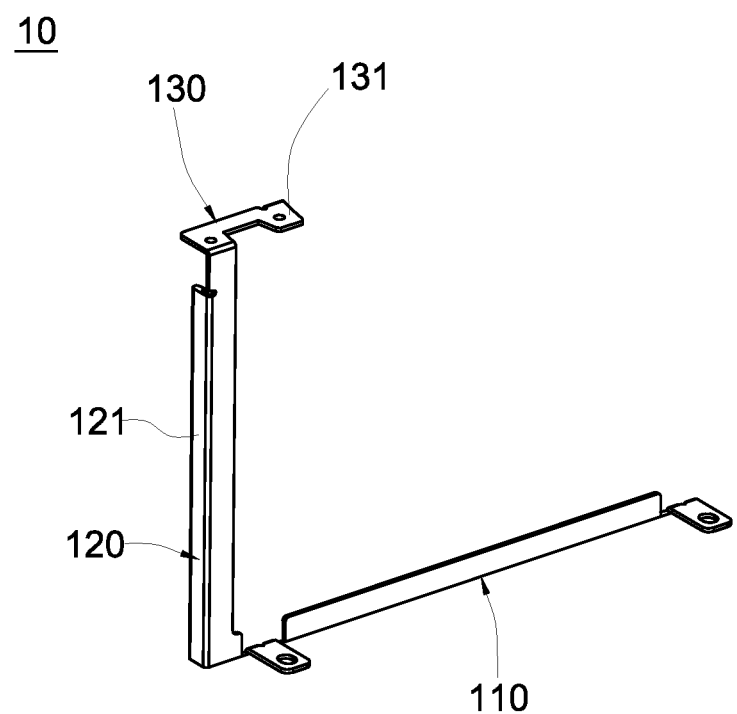
FIG. 6 is side, perspective view of the supporting frame in accordance with a second embodiment.
Figure 7:
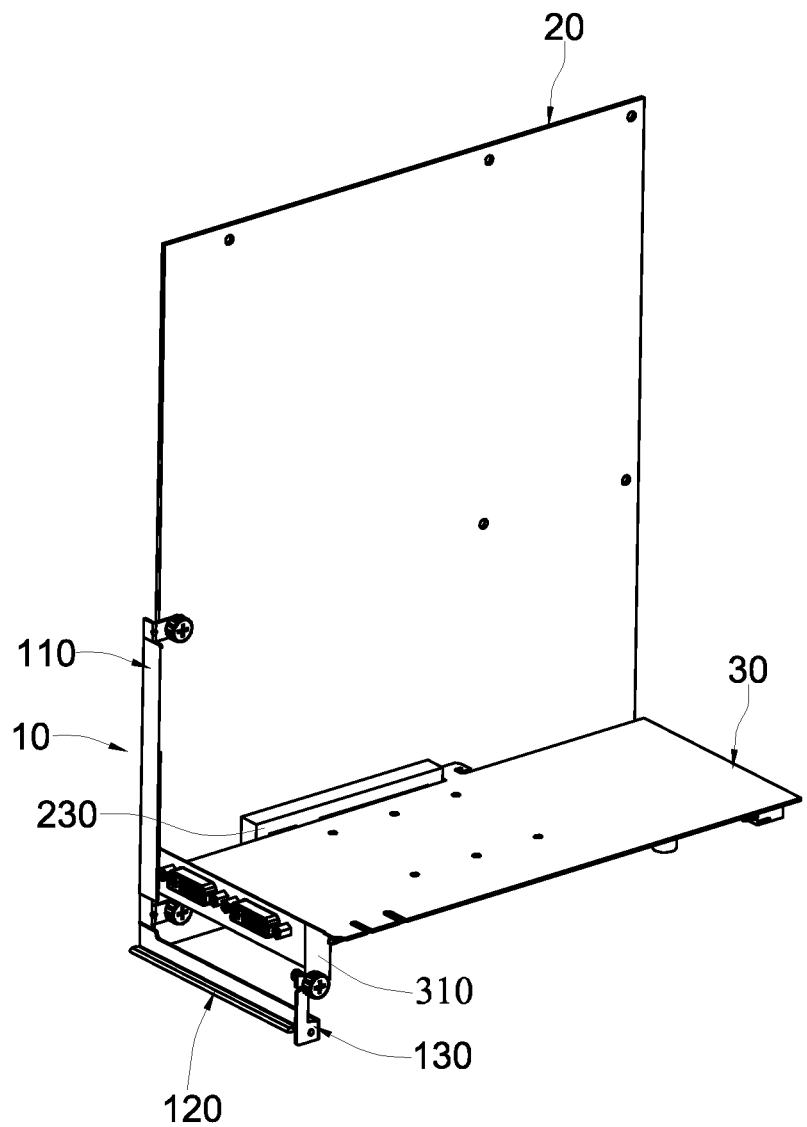
FIG. 7 is a side, perspective view of the supporting frame in use situation in accordance with the second embodiment.

Referring to FIGS. 6 and 7, most structures of the supporting frame in accordance with the second embodiment are the same as the supporting frame in accordance with the first embodiment. The difference is that the supporting frame 10 disclosed in second embodiment only includes a first engagement section 110, a supporting section 120, and a second engagement section 130. In addition, only one engagement portion 131 is placed on the second engagement section 130.

The engagement portion 131 is also used for fixing the expansion card 30. In an event the motherboard 20 is positioned perpendicularly on the working surface, the motherboard 20 may stand upright on the working surface via the cooperation between the contacting surface 121 of the supporting section 120 and the second side of the motherboard 20. In addition, the force from the weight of the expansion card 30 to the slot 230 of the motherboard 20 will be dispersed by the support from the second engagement section 130.

Figure 8:
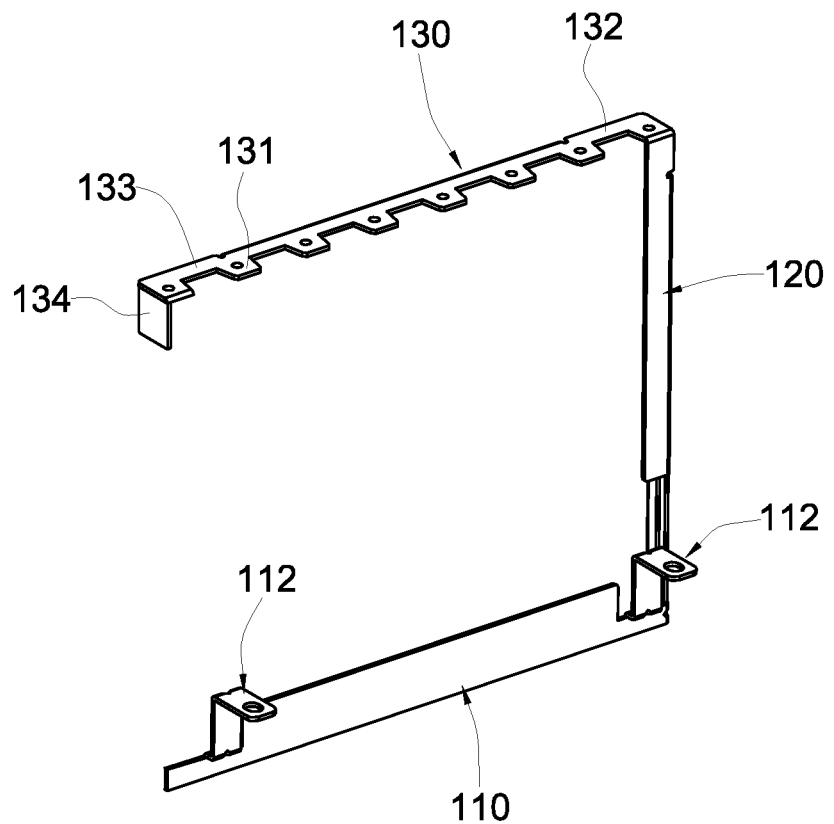
FIG. 8 is a side, perspective view of the supporting frame in accordance with a third embodiment.
Figure 9:
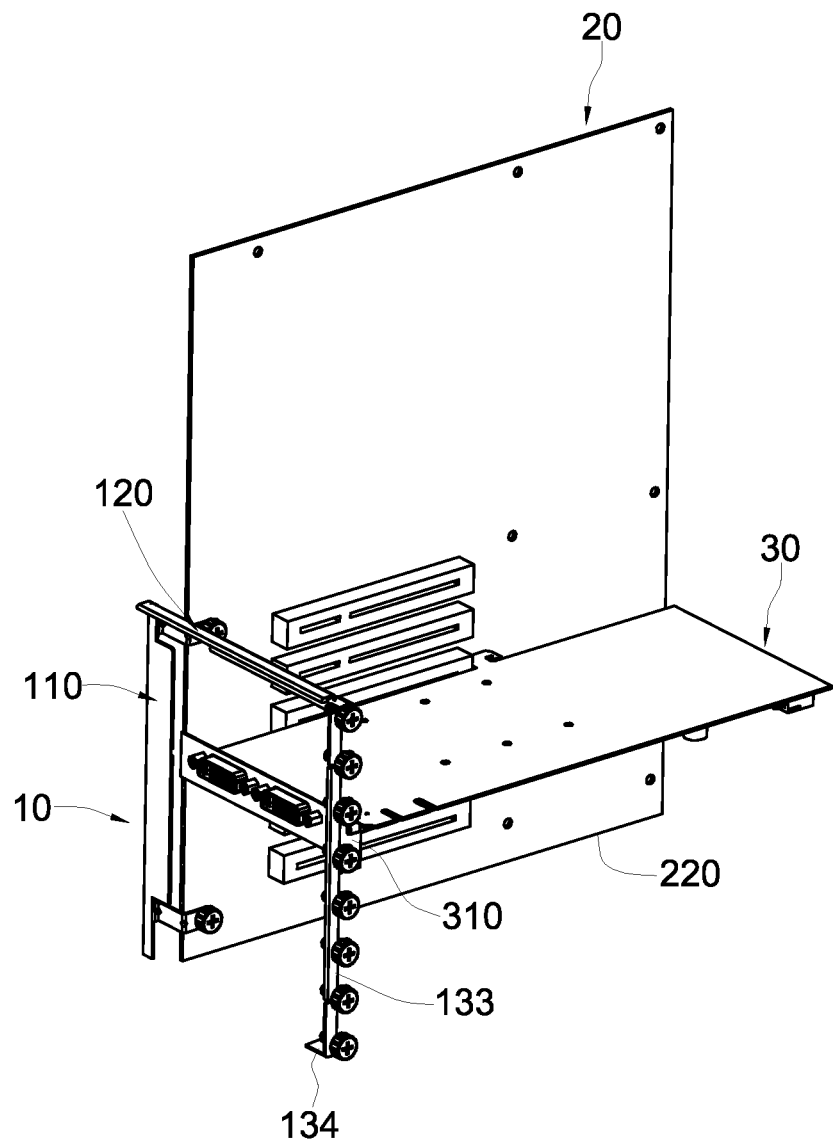
FIG. 9 is a side, perspective view of the supporting frame in use situation in accordance with the third embodiment.

Please refer to FIGS. 8 and 9. Most structures of the supporting frame in accordance with the third embodiment are the same as the supporting frame in accordance with the first embodiment. The difference is that the supporting frame 10 disclosed in the third embodiment includes a first engagement section 110, a supporting section 120, and a second engagement section 130. In addition, when the supporting frame 10 is fixed on the motherboard 20 via two bending plates 112 of the first engagement section, one end of the supporting section 120 of the supporting frame 10 is connected to one end of the first engagement section 110 far away from the second side 220, and another end of the supporting section 120 is connected to the second engagement section 130.

In the third embodiment, the second engagement section 130 includes a fixing end 132, a free end 133, and a plurality of engagement portions 131. The engagement portions 131 are space apart with each other and placed between the fixing end 132 and the free end 133 for fixing the fastening plate 310 of the expansion card 30. The fixing end 132 is connected with the supporting section 120. The free end 133 is extended along a direction perpendicular to the second side 220 of the motherboard 20. The surface of the free end 133 of the second engagement section 130 can be made flush with the second side 220 of the motherboard 20, but it should not be limited. Therefore, the motherboard 20 is able to stand upright on the working surface with the support from the second side 220 and the free end 133 of the second engagement section 130.

In the third embodiment, to increase the stability of the motherboard 20 standing on the working surface, it is possible to bend the second engagement section 130 of the supporting frame 10 to form a barrier 134. The barrier 134 is connected with the free end 133 along a direction perpendicular to the first engagement section 110 and is made flush with the second side 220 of the circuit 20. Therefore, when the motherboard 20 stands on the working surface, the force from the weight of the expansion card 30 to the slot 230 can be dispersed by the support from the second engagement section 130. In addition, the barrier 134 leans on the working surface to increase the contacting area between the supporting frame 10 and the working surface so as to increase the supporting efficiency for the motherboard 20. Meanwhile, in the embodiment that the length of one end of the first engagement section 110 unconnected with supporting section 120 is flush with the second side 220 of the motherboard 20, the first engagement section 110 and the second engagement section 130 support the motherboard 20 respectively at the two opposite sides of the motherboard 20. As a result, the risk that the motherboard 20 leans down can be decreased when the motherboard 20 stands on the working surface.

The foregoing description of the embodiments of the disclosure has been presented only for the purposes of illustration and description and is not intended to be exhaustive or to limit the disclosure to the precise forms disclosed. Many modifications and variations are possible in light of disclosure above. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A supporting frame adapted for fixing at least one expansion card to a motherboard, wherein the motherboard includes a first edge, a second edge adjacent to the first edge, and at least a slot, the expansion card is inserted in the slot and includes an fastening plate located on one side of the expansion card far from the slot; said supporting frame comprising:

a first engagement section, fixed on the first edge of the motherboard, wherein said first engagement section comprises a main body and two bending plates, said main body is connected with said supporting section, said two bending plates are extended from said main body, each of said bending plates comprises a perpendicular portion parallel to said main body and a bending portion perpendicular to said main body, and said perpendicular portion is located on the first edge of the motherboard, and said bending portion is fixed on one side surface of the motherboard;

a supporting section, connected to one end of said first engagement section adjacent to the second edge;

a second engagement section, connected to said supporting section, and spaced apart from said first engagement section; and two locking members, wherein one end of each of said locking members is moved through each of said bending plates respectively and is fixed on the motherboard, and another end of each of said locking members is pressed against each of said bending plates respectively;

wherein a height is defined by said second engagement section relative to the motherboard, said second engagement section matches with the fastening plate of the expansion card, and the fastening plate is fixed on said second engagement section, thereby, the motherboard is positioned on a working surface horizontally or stands on the working surface via the second edge and said supporting section.

2. The supporting frame as claimed in claim 1, wherein said supporting section comprises a contacting surface, said contacting surface is made flush with the second edge of the motherboard; thereby the motherboard stands on the working surface via said contacting surface and the second edge.

3. The supporting frame as claimed in claim 1, wherein said second engagement section comprises at least one engagement portion, said engagement portion corresponds to the slot of the motherboard; thereby the fastening plate of the expansion card is fixed on said engagement portion.

4. The supporting frame as claimed in claim 1, further comprising two locking members and a pressing plate, wherein the motherboard further includes two positioning holes, said bending plates correspond to the two positioning holes respectively, said pressing plate is placed on opposite side surface of the motherboard relative to said bending plates, wherein one end of each of said locking members is moved through each of said bending plates and each of the positioning holes and is fixed on said pressing plate, and another end of each of said locking members is pressed against each of said bending plates respectively.

5. The supporting frame as claimed in claim 1, wherein said supporting section is perpendicular to the motherboard, and two opposite ends of said supporting section are protruding respectively on two opposite surfaces of the motherboard.

6. The supporting frame as claimed in claim 1, further comprising a securing unit placed on said second engagement section, thereby said securing unit clamps the fastening plate of the expansion card with said second engagement section.

7. The supporting frame as claimed in claim 1, further comprising an assisting section, placed at one end of said first engagement section far away from the second edge, and connected between said first engagement section and said second engagement section.

8. A supporting frame adapted for fixing at least one expansion card to a motherboard, wherein the motherboard includes a first edge, a second edge, and at least a slot, the expansion card is inserted in the slot and includes a fastening plate on one side of the expansion card far from the slot; said supporting frame comprising:
- a first engagement section, fixed on the first edge of the motherboard, wherein said first engagement section comprises a main body and two bending plates, said main body is connected with said supporting section, said bending plates are extended from said main body, and each of said bending plates includes a perpendicular portion parallel to said main body and a bending portion perpendicular to said main body, wherein said perpendicular portion is located on the first edge of the motherboard, and said bending portion is fixed on one side surface the motherboard;
- a supporting section, connected to said first engagement section;
- a second engagement section, connected to said supporting section, and spaced apart from said first engagement section; and
- two locking members, wherein one end of each of said locking members is moved through each of said bending plates respectively and is fixed on the motherboard, and another end of each of said locking members is pressed against each of said bending plates respectively;
- wherein a height is defined by said second engagement section relative to the motherboard, and said second engagement section matches the fastening plate, the fastening plate is fixed on said second engagement section;
- wherein said second engagement section comprises a fixing end and a free end, said fixing end is connected to said supporting section, said free end is extended toward the second edge of the motherboard, and said free end corresponds to the second edge, thereby; the motherboard is positioned on a working surface or stands on the working surface via the second edge and said free end.

9. The supporting frame as claimed in claim 8, wherein said free end of said second engagement section further comprises a barrier, said barrier is extended along a direction perpendicular to said first engagement section, and is flush with the second edge of the motherboard, thereby, the motherboard stands on the working surface via said barrier and the second edge.

10. The supporting frame as claimed in claim 8, wherein said second engagement section comprises at least one engagement portion, said engagement portion corresponds to the slot of the motherboard; thereby the fastening plate of the expansion card is fixed on said engagement portion.

11. The supporting frame as claimed in claim 8, further comprising two locking members and a pressing plate, wherein the motherboard further includes two positioning holes, said two bending plates corresponds to the two positioning holes respectively, said pressing plate is placed on opposite side surface of the motherboard relative to said bending plates, wherein one end of each of said locking members is moved through each of said bending plates and each of said positioning holes, and is fixed on said pressing plate, wherein another end of each of said locking members is pressed against each of said bending plates respectively.

12. The supporting frame as claimed in claim 8, wherein said main body of said first engagement section and said pressing plate are located at two opposite side surfaces of the motherboard respectively.

13. The supporting frame as claimed in claim 8, further comprising a securing unit, placed on said second engagement section, thereby, said securing unit clamps the fastening plate of the expansion card with said second engagement section.

* * * * *